United States Patent [19]

Bishop et al.

[11] Patent Number: 5,041,881
[45] Date of Patent: Aug. 20, 1991

[54] WHISKERLESS SCHOTTKY DIODE

[75] Inventors: William L. Bishop, Charlottesville; Kathleen A. McLeod, Herndon; Robert J. Mattauch, Charlottesville, all of Va.

[73] Assignee: The United States of America as represented by the Administrator of the National Aeronautics and Space Administration, Washington, D.C.

[21] Appl. No.: 318,981

[22] Filed: Mar. 6, 1989

Related U.S. Application Data

[63] Continuation-in-part of Ser. No. 55,809, May 18, 1987, abandoned.

[51] Int. Cl.$^5$ .................. H01L 29/48; H01L 23/48; H01L 27/02; H01L 29/06
[52] U.S. Cl. ........................ 357/15; 357/55; 357/68; 357/69; 357/47
[58] Field of Search .................. 357/15, 55, 68, 69, 357/47

[56] References Cited

U.S. PATENT DOCUMENTS 4,499,656 2/1985 Fabian et al. .................. 357/15

Primary Examiner—Mark Prenty
Attorney, Agent, or Firm—R. Dennis Merchant; Harold W. Adams; Ronald F. Sandler

[57] ABSTRACT

A Schottky diode for millimeter and submillimeter wave applications is comprised of a multi-layered structure including active layers of gallium arsenide on a semi-insulating gallium arsenide substrate with first and second insulating layers of silicon dioxide on the active layers of gallium arsenide. An ohmic contact pad lays on the silicon dioxide layers. An anode is formed in a window which is in and through the silicon dioxide layers. An elongated contact finger extends from the pad to the anode and a trench, preferably a transverse channel or trench of predetermined width, is formed in the active layers of the diode structure under the contact finger. The channel extends through the active layers to or substantially to the interface of the semi-insulating gallium arsenide substrate and the adjacent gallium arsenide layer which constitutes a buffer layer. Such a structure minimizes the effect of the major source of shunt capacitance by interrupting the current path between the conductive layers beneath the anode contact pad and the ohmic contact. Other embodiments of the diode may substitute various insulating or semi-insulating materials for the silicon dioxide, various semiconductors for the active layers of gallium arsenide, and other materials for the substrate, which may be insulating or semi-insulating.

37 Claims, 3 Drawing Sheets

5,041,881

WHISKERLESS SCHOTTKY DIODE

ORIGIN OF THE INVENTION

The invention described herein was made in the performance of work under a NASA contract and is subject to Public Law 96-517 (35 U.S.C. section 200 et seq.). The contractor has not elected to retain title to the invention.

Whiskerless Schottky Diode

This is a continuation-in-part of application Ser. No. 055,809, filed May 18, 1987, now abandoned.

TECHNICAL FIELD

This invention relates generally to semiconductor devices and more particularly to a whiskerless, multi-layered Schottky barrier diode.

BACKGROUND ART

Schottky barrier diodes with anode diameters in the submicron to micron range are generally known. Such devices are typically used as resistive mixer elements and varactor multipliers in the 100 GHz to 3 THz frequency range. The requirements of low shunt capacitance across the diode junction and low junction capacitance itself, however, severely restrict diode design. One diode in an array of Schottky diodes, which is contacted with a fine pointed wire or whisker having a diameter of from between 12 to 25 microns, has long been used to satisfy the need for minimum shunt capacitance. In order to operate at these frequencies, the pointed wire or whisker also provides a tuning inductance which can be varied by changing whisker shape and length. Shunt capacitance from the whisker is on the order of 1 fF (femto-farads), i.e. $1 \times 10^{-15}$ farads, and zero bias junction capacitance values as low as 0.6 fF have been achieved with this type of device.

Whisker contacted diodes, however, have a number of serious disadvantages. For example, they are often mechanically unstable in vibration environments such as in a satellite launch and, due to the fact that operation is sometimes required at cryogenic temperatures in order to obtain desirable signal to noise ratios and enhanced performance, special mounting structures are needed to maintain whisker contact as the various elements change dimension on cooling. Also, whisker contacted diodes are virtually impossible to incorporate into integrated circuitry including diode arrays or integral antenna schemes. Furthermore, small area diodes having a diameter on the order of 1 micron or less require great skill and effort to contact.

As a result of these limitations, whiskerless Schottky diodes have been developed. Such diodes comprise epilayered structures and provide a significant improvement in eliminating some or all of the aforementioned problems. These devices typically are comprised of one or more layers of gallium arsenide formed on a semi-insulating substrate with an overlying anode contact pad and ohmic contact pad which may be adjacently located on the same or top side of the diode structure. One major problem still remains, however, and comprises the shunt capacitance from the anode contact pad to the underlying gallium arsenide layer. This capacitance is especially detrimental since it is orders of magnitude larger than the diode junction capacitance and other shunt capacitance components and since it provides a path for displacement current to flow at radio frequencies (RF) from the anode contact pad to the underlying conductive gallium arsenide layers. This current then flows to the ohmic contact through said conductive layers, effectively shunting the RF signal to be detected around the diode junction. This capacitance can be only partially eliminated by standard state of the art beam lead technology.

Several schemes have been resorted to recently in order to reduce or attempt to eliminate this major source of shunt capacitance. One of these comprises a mesa structure wherein the active gallium arsenide layers are etched away and the anode contact pad is formed over the material of the semi-insulating substrate. This technique is difficult to implement, however, because of processing problems associated with the formation and etching of oxide, photoresist and metal layers on a non-planar surface. These problems are further exacerbated by the need to produce very small anode diameters for high frequency operation.

Another technique involves a structure wherein a proton beam is used to convert the gallium arsenide material beneath the anode contact pad to semi-insulating material, thus eliminating the aforementioned processing difficulties. The disadvantage of this type of device is that there is a requirement for a relatively high energy proton source for conversion of relatively thick (3 to 4 microns), degenerately doped buffer layers of gallium arsenide and the additional photolithographic, oxide and metallization steps needed to protect the anode and ohmic contact areas from the proton beam.

STATEMENT OF THE INVENTION

Accordingly, it is an object of the invention to provide an improvement in semiconductor devices.

It is a further object of this invention to provide an improvement in semiconductor diode devices which operate at extremely high frequencies.

It is another object of this invention to provide an improvement in Schottky diodes for millimeter and submillimeter wave application.

It is yet another object of this invention to provide an improvement in planar Schottky diodes which provide both low junction and shunt capacitances.

Still a further object of this invention is to provide a whiskerless Schottky diode for millimeter and submillimeter wave application which is relatively simple to fabricate.

Briefly, the foregoing and other objects are achieved by a Schottky diode which comprises a multi-layered device including a semi-insulating or insulating substrate overlayered with one or more active layers of semiconductor material selected from elemental groups or a combination of such groups such as Group III-V compounds, typically gallium arsenide (GaAs). A pair of semi-insulating or insulating layers comprised of silicon dioxide ($SiO_2$), for example, are provided on the top of the active layers and an anode window is formed therethrough to the uppermost layer of gallium arsenide. A metal, such as platinum or gold, is deposited on the aforementioned gallium arsenide layer through this window to form an anode which includes a metal-semiconductor junction. An anode contact pad is formed on the top of the silicon dioxide layer. The anode contact pad includes a forwardly projecting anode contact finger element of a reduced width dimension which extends to the anode window and to the metallization of the anode. An ohmic contact pad is located on, but is separated from, the contact finger on the same side of the device. A surface channel or trench of predetermined dimensions is formed in the body of the active layers of the semiconductor diode structure between the anode contact pad and the anode window. The depth of the channel or trench extends downwardly at least to the interface between the first gallium arsenide layer and the substrate. The existence of this channel or trench eliminates the harmful effects of the capacitance between the anode contact pad and the underlying conductive gallium arsenide by providing a means of cutting off the current path between said conductive layers beneath the anode contact pad and the ohmic contract. Thus, the relatively large anode contact pad capacitance is effectively isolated from acting as a shunt path for the desired RF signal. While air is the preferred material within the trench, other insulating materials such as polymers, glasses, or ceramics may be used or the trench may be evacuated.

The foregoing, as well as other objects, features and advantages of the invention will become apparent from the following detailed description when taken in conjunction with the accompanying drawings.

DETAILED DESCRIPTION OF THE INVENTION

Figure 1:
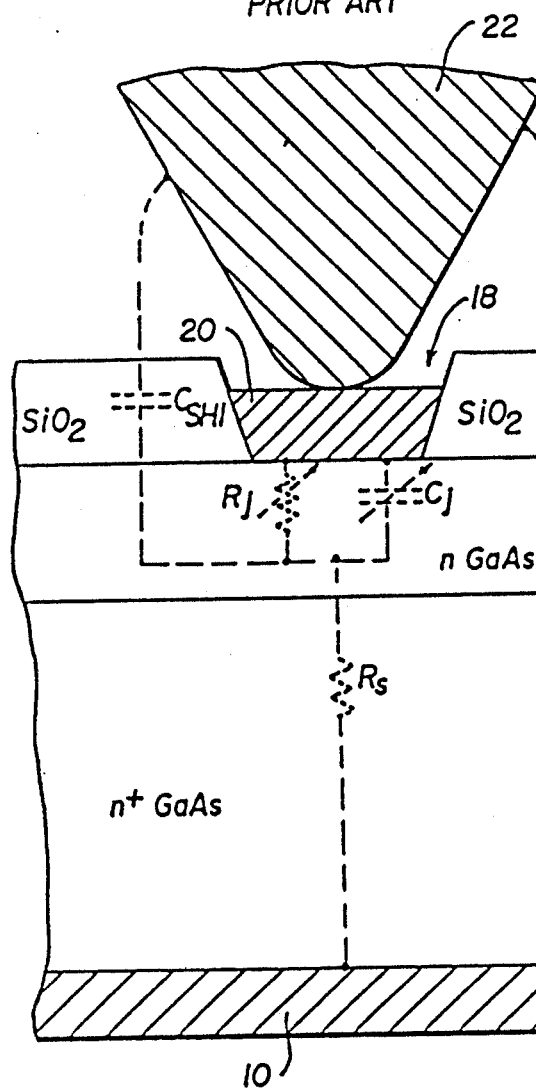
FIG. 1 is a partial cross-sectional view illustrative of a well known Schottky barrier diode which is contacted with a fine pointed wire or whisker.

Referring now to the drawings and more particularly to FIG. 1, shown thereat is a partial cross-sectional view of a known prior art device called a whisker-contacted Schottky barrier diode. This device is typically fabricated using semiconductor material selected from Group III-V compounds such as gallium arsenide (GaAs). As illustrated, the Schottky diode comprises a multi-layered device, fabricated in a well known manner, including a heavily doped (n+) GaAs layer 12 on which is formed a metallic ohmic contact layer 10 and on top of which is formed a second less heavily doped (n) GaAs layer 14. Both GaAs layers 12 and 14 comprise active layers, with the lower, relatively thicker GaAs layer 12 acting as a buffer layer. On top of the upper n GaAs layer 14 is formed a layer of semi-insulating or insulating material, typically silicon dioxide (SiO$_2$) 16. The SiO$_2$ layer 16 has an opening for an anode region and includes a window 18 in which there is plated a metallic anode 20. The metallization is typically comprised of platinum or gold.

This type of device, moreover, is usually included in an array of like devices, not shown. In order to contact an individual diode such as shown in FIG. 1, a fine wire 22, commonly referred to as a whisker, and having a diameter in the range of 12 to 25 microns, is fashioned to have a pointed end which is placed in contact with the anode 20. Such a device exhibits a variable junction resistance $R_j$ and a variable junction capacitance $C_j$ as well as two shunt capacitances $C_{SH1}$, $C_{SH2}$, and a series resistance $R_s$. These impedances are shown in phantom view in FIG. 1, but are depicted in schematic diagrammatic form in FIG. 2.

Figure 2:
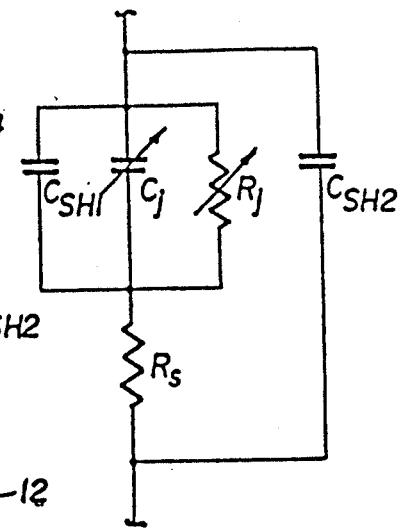
FIG. 2 is a simplified electrical schematic diagram illustrative of some of the electrical impedances associated with the device as shown in FIG. 1.

Referring briefly to FIG. 2, the resistance $R_s$ is in series with the parallel combination of the junction resistance and capacitance, $R_j$ and $C_j$, and the shunt capacitance $C_{SH1}$. The second shunt capacitance $C_{SH2}$ is in parallel with the total combination of the aforesaid elements. Since $C_{SH2}$ is outside of $R_s$, the whisker 22 can be shaped to provide a tuning inductance or alternatively, an external inductance may be provided, whereby the shunt capacitance $C_{SH2}$ can be tuned out. Such is not the case, however, with respect to the other shunt capacitance $C_{SH1}$. Because $C_{SH1}$ is in series with $R_s$, it cannot be tuned out, and it provides a source of undesired capacitance which acts as a signal shunt which, in turn, bypasses the active device in the frequency range of 100 GHz to 3 THz.

Figure 3:
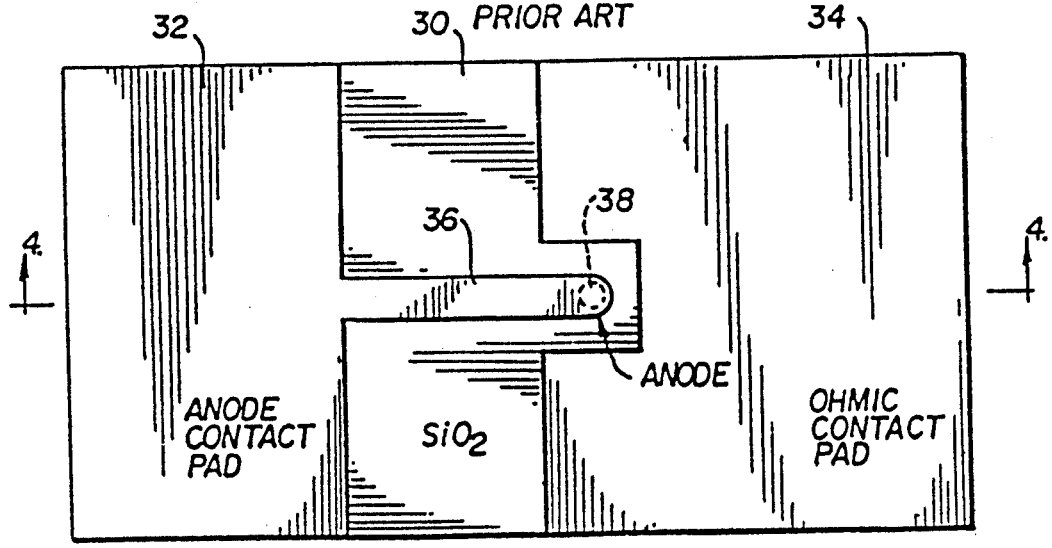
FIG. 3 is a top planar view generally illustrative of a planar Schottky diode.
Figure 4:
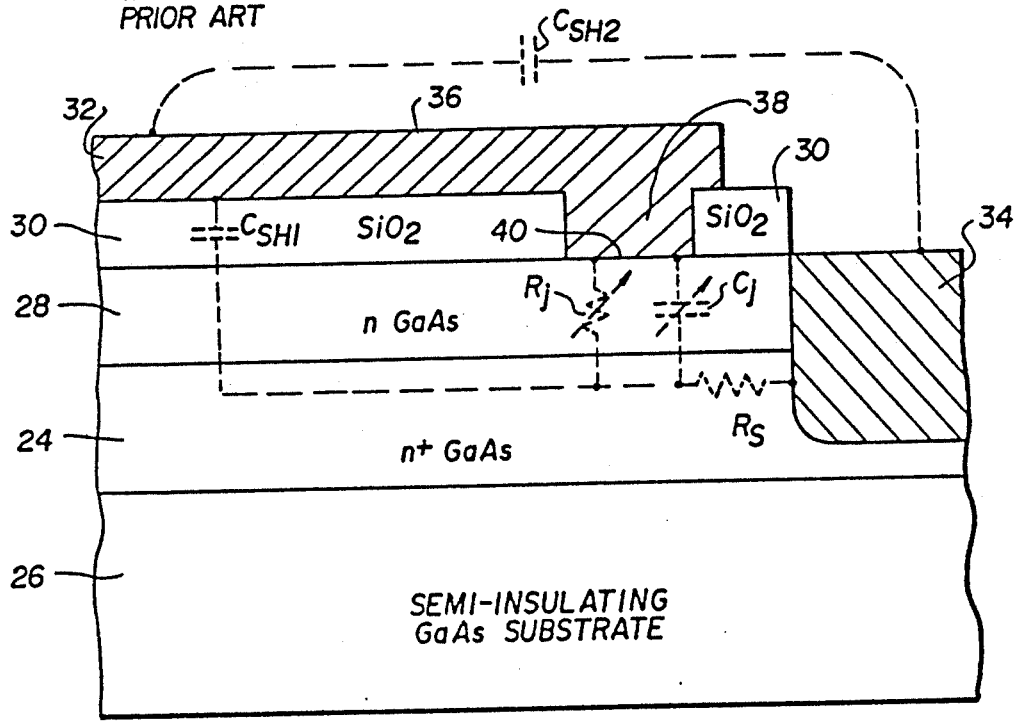
FIG. 4 is a sectional view of the device as shown in FIG. 3 taken along the lines 4—4 thereof.

The limitations and disadvantages of a Schottky barrier diode illustrated, for example, in FIG. 1, have been noted above and, in order to overcome these problems, the whiskerless Schottky diode was developed. This type of device is shown for purposes of illustration in FIGS. 3 and 4 and comprises a structure wherein an n+GaAs buffer layer 24 is fabricated on a semi-insulating or insulating GaAs substrate 26. A layer of n GaAs 28 is formed on the buffer layer 24 and a semi-insulating or insulating layer, of SiO$_2$ 30, for example, is formed on top of layer 28 as before. This device differs from the device of FIG. 1 in that it now includes two adjacent, but separated, layers of metallization 32 and 34 which define anode contact pad and ohmic contact pad areas, respectively. The anode contact pad metallization is deposited on the top of the SiO$_2$ surface 30 and typically includes a relatively thin strip in the form of a contact finger which extends at least to an anode window 38 where it descends to the n GaAs layer 28. The metallization for anode 40 may include a relatively thin surface of selected metal such as platinum. The size of the window, moreover, constitutes a design feature of the device. The ohmic contact pad 34, as shown in FIG. 4, is fabricated by forming a recess of a selected depth into a n GaAs layer 28 and the n+GaAs layer 24. Also as shown in FIG. 3, the ohmic contact pad partially borders the tip of the anode contact finger 36 at the anode 40.

Further, as shown in FIG. 4, the same impedances, including the two shunt capacitances $C_{SH1}$ and $C_{SH2}$ exist along with the junction resistance $R_j$, the junction capacitance $C_j$, and the series resistance $R_s$, as shown in the phantom lines. Shunt capacitance $C_{SH1}$ is due primarily to electric field lines between the anode contact pad and the underlying conductive gallium arsenide with the intervening silicon dioxide as the dielectric. The anode contact finger contributes a small percentage of this capacitance by virtue of its much smaller area compared to the anode contact pad. Capacitance $C_{SH2}$ is due primarily to fringing electric field lines between the anode contact pad and the ohmic contact with the intervening air as the dielectric. These impedances are interrelated in the same fashion as shown in FIG. 2. It is to be noted, however, that the shunt capacitance $C_{SH1}$, from the anode contact pad 32 to the underlying n GaAs layer 28, can be more than is desirable. It is, therefore, necessary to further reduce or eliminate the value of the shunt capacitance $C_{SH1}$, which may have a value in the range of $1 \times 10^{-12}$ farads, as opposed to the junction capacitance $C_j$, which, in turn, can have a value as low as $0.7 \times 10^{-15}$ farads. Accordingly, it can be seen that $C_{SH1}$ overwhelms the junction capacitance, $C_j$, in terms of magnitude.

Figure 5:
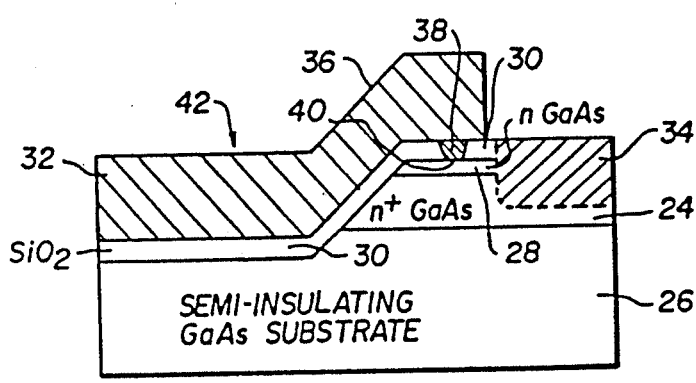
FIGS. 5 and 6 are cross-sectional views generally illustrative of two other types of whiskerless Schottky diodes.
Figure 6:
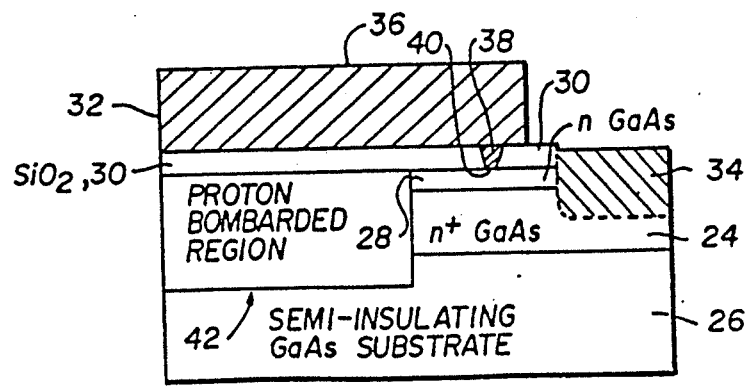

Several different techniques have been resorted to in order to eliminate this source of shunt capacitance, two of which are shown in FIGS. 5 and 6. Referring now to FIG. 5, there is shown a mesa structure in which a portion of the active GaAs layers 24 and 28, as well as a portion of the GaAs substrate 26, are etched away at 42 on the side away from the ohmic contact pad 34, whereupon the SiO$_2$ layer 30 is formed in a stepped fashion up to the location of the anode window 38 and with the anode contact pad metallization 32 and the contact finger 36 formed thereover. While shunt capacitance, $C_{SH1}$, has been eliminated by the mesa structure, a new impedance, $C_{SH3}$, is present. This shunt capacitance is due to electric field lines from the anode contact pad to the conductive gallium arsenide beneath the anode and beneath the ohmic contact with the intervening silicon dioxide and semi-insulating gallium arsenide as the dielectric. However, because of the relatively large separation of the capacitor plates, this component is very small compared to the anode contact pad capacitance, $C_{SH1}$, of FIG. 4. This type of structure suffers from the relative difficulty in implementing the device because of processing problems associated with the formation and etching of oxide, photoresist and metal layers when fabrication is attempted on non-planar surfaces. These problems are further compounded by the extremely small anode diameters in the region 38 required for operation in the GHz-THz region.

In order to avoid the problems associated with the mesa type structure of FIG. 5, a whiskerless Schottky structure, as shown in FIG. 6, was developed wherein the region of the GaAs active layers 24 and 28 beneath the anode contact pad 32 and contact finger 36 at 42 are converted to semi-insulating material. This is achieved, for example, by proton beam bombardment of the region 42. This technique is well known to those skilled in the art, but it requires a relatively high energy proton source in order to achieve complete conversion of the relatively thick n doped GaAs layer 24. Also, there is an additional problem encountered in the photolithographic and metallization steps needed to protect the anode 40 and ohmic contact area 34 from the proton beam. This structure, like the mesa structure of FIG. 6, includes the shunt capacitance component, $C_{SH3}$. In each instance, the attempt has been to substantially reduce or attempt to eliminate altogether the shunt capacitance $C_{SH1}$ which, as shown, acts as an undesirable signal shunt.

Figure 7:
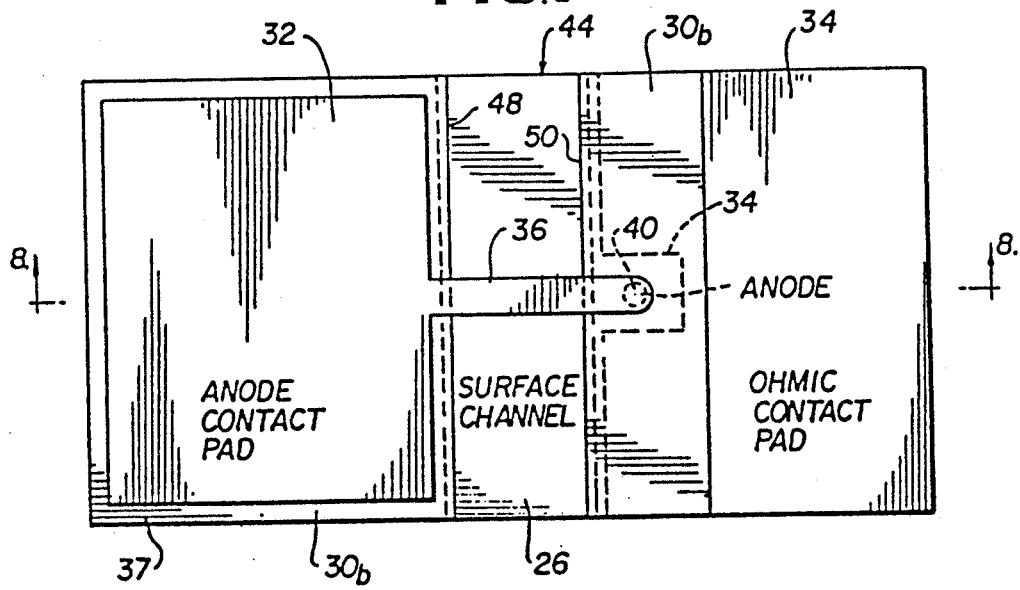
FIG. 7 is a top planar view generally illustrative of a diode device in accordance with this invention.
Figure 8:
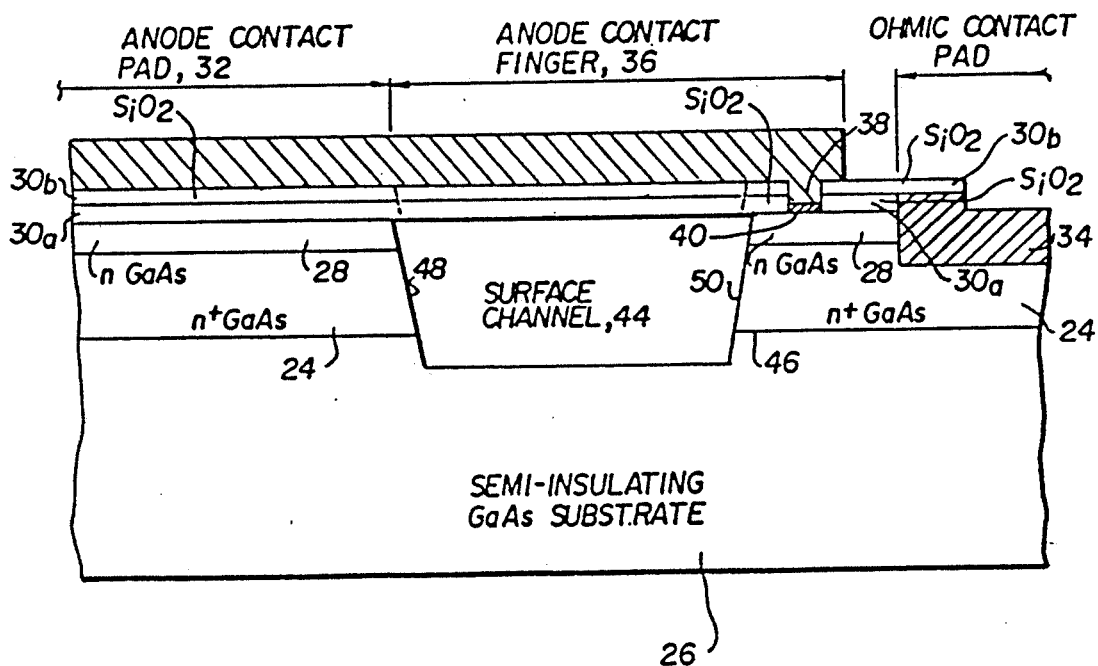
FIG. 8 is a partial sectional view of the device shown in FIG. 7 taken along the lines 8-8 thereof.

This now leads to a consideration of the preferred embodiment of the invention which is illustrated in FIGS. 7 and 8. Shown thereat is a whiskerless Schottky diode of the multi-layered type which is similar to that shown in FIGS. 3 and 4 but differs therefrom by the inclusion of a surface air channel or trench 44 fabricated across the width dimension of the device, as shown in FIG. 7, through at least the GaAs layers 24 and 28 and beneath the contact finger element as shown in FIG. 8, providing thereby an air bridge structure. The channel could be filled with a dielectric other than air. Additionally, two layers 30$_a$ and 30$_b$ of SiO$_2$ are shown in the semiconductor structure of FIG. 8. These SiO$_2$ layers are necessary to implement the fabrication sequence to be hereinafter described; however, a single layer of SiO$_2$ could be employed when some other fabrication sequence is utilized. The depth of the channel 44 must extend through the n GaAs buffer layer 24 at least to the interface 46 between the GaAs substrate 26 and the n$^+$GaAs layer 24. However, as shown in FIG. 8, this channel extends into the substrate 26. Also in this embodiment, the channel 44 includes a removal of the SiO$_2$ layers 30$_a$ and 30$_b$ on both sides of the anode contact finger 36, although this is not necessary for the reduction of shunt capacitance, $C_{SH1}$, but rather to expose the GaAs surface 28 for etching. In some instances the SiO$_2$ layers 30$_a$ and 30$_b$ are removed beneath the contact finger 36 and across the channel. The channel 44 includes a pair of inclined front and rear sidewalls 48 and 50 which provide a generally concave open channel configuration. This occurs as a result of the etching process and the selected orientation of the crystallographic axes of the materials utilized. Also the etching process provides an undercut of the sidewalls 48 and 50 relative to the SiO$_2$ layers 30$_a$ and 30$_b$.

The size of the anode window 38 again is a design feature and a relatively thin layer of selected metal, such as platinum, is deposited on the exposed face of the n GaAs layer 28, at the location of the anode window, to form the anode 40. The anode metallization can, when desired, be deposited at a selected depth in the n GaAs layer 28 by first etching the layer to the selected depth. The front channel wall 50 is also fabricated as close to the anode as possible and the overlap of the anode contact finger 36 passed the anode 40 on the SiO$_2$ layers 30$_a$ and 30$_b$ should be as small as possible. Again, these are design constraints encountered in the fabrication process. In the preferred embodiment, moreover, the ohmic contact pad 34 is fabricated to a selected depth into the n$^+$GaAs layer 24; however, it could, when desirable, be fabricated on the top of the n GaAs layer 28.

The purpose of having the channel 44 go through the GaAs active layers 24 and 28 is to minimize the effect of the shunt capacitance $C_{SH1}$ by cutting off the current path between the conductive gallium arsenide beneath the anode contact pad and the ohmic contact. Although capacitance $C_{SH1}$ has not been eliminated from the structure, it now appears in series with the much smaller capacitance $C_{SH3}$. The resulting shunt capacitance due to the anode contact pad is virtually the same as that achieved in the mesa or proton bombarded structure. (FIG. 8). This technique of minimizing the deleterious effect of shunt capacitance $C_{SH1}$ is totally different from that used in the mesa or proton bombarded structures disclosed in FIGS. 5 and 6. However, proton bombardment of the regions underlying the anode contact pad 32 can be used in combination with the surface channel 44. Such a structure would provide reduced shunt capacitance compared to proton bombardment alone due to the lower dielectric constant of the air under the contact finger 36 compared to that of gallium arsenide. Again, the capacitive effect of having the channel filled with something other than air will depend on the dielectric constant of that material.

The method involved in fabricating the embodiment of the invention, as depicted in FIGS. 7 and 8, involves known fabrication techniques and is directed primarily to the formation of the contact finger 36 and thereafter etching the surface channel 44 from beneath it across the width of the device under the contact finger and having a predetermined depth into the active and inactive layers of the GaAs semiconductor material. The length, width, and depth of the channel or trench must be sufficient to minimize the conduction and displacement currents from the gallium arsenide beneath the anode contact pad to the ohmic contact. As shown, it extends transversely across the entire width of the device. It should be noted, however, that this channel can have a variety of shapes and directions. It could be curved, for example, or at some angle other than 90° to the finger. The trench or channel can be extended to include the border region 37, thereby forming a moat which surrounds the anode contact pad. The moat may be a necessity in integrated circuits or diode arrays to completely isolate the diode from other circuit elements.

At present, the following sequence of processing steps is utilized in fabricating the device shown in FIGS. 7 and 8:

(1) a prefabricated epitaxial wafer for producing a plurality of individual chips and including a semi-insulating GaAs substrate layer 26, an intermediate n+GaAs buffer layer 24 and an upper n GaAs layer 28, which is readily available on the market, is tailored to a particular thickness;

(2) a layer $30_a$ of $SiO_2$ is then deposited across the entire surface of the upper n GaAs layer 28;

(3) an ohmic contact region 34 is next formed by use of a resist pattern and followed by an etching step in the $SiO_2$ layer $30_a$ and, in some cases, the GaAs layers 24 and 28;

(4) an ohmic contact metallization layer is formed by electroplating a sequence of tin, tin/nickel and gold over the ohmic contact pad area;

(5) an alloying of the ohmic contact area is next provided;

(6) following the alloying step, the ohmic contact layer 34 of step (4) is overlaid with a layer of gold, not shown;

(7) a second layer $30_b$ of $SiO_2$ is then deposited over the entire surface including the gold plated ohmic contact pad area 34;

(8) a photoresist layer is applied and patterned for the anode window 38 which is then etched through the $SiO_2$ layers $30_a$ and $30_b$ at the prescribed location;

(9) the photoresist is next removed and a thin layer 40 of platinum followed by a thicker layer of gold is plated into the anode window onto the n GaAs layer 28 to form the anode 40;

(10) the entire upper surface of the device is coated with a thin layer of chromium followed by a thin layer of gold, also not shown, and is achieved, for example, by sputter deposition;

(11) a photoresist is applied and patterned defining the anode contact pad 32, finger 36 and a silicon dioxide border 37 which is followed by electroplating a relatively thick layer of gold for implementing the contact pad 32 and finger 36 as well as the border 37 for implementation of a subsequent dicing of the wafer;

(12) the photoresist is removed and the thinner layers of gold and chromium are etched away from the region outside of the anode contact pad 32 and contact finger 36;

(13) a photoresist is applied and patterned defining the channel region 44 and the layers $30_a$ and $30_b$ of $SiO_2$ thereat are first etched away;

(14) following the etching of the $SiO_2$ in the channel region, the photoresist is removed followed by etching of the GaAs layers 28 and 24 substantially to or into the substrate layer 26. A single GaAs etching process removes the GaAs, both active and semiinsulating, from both the regions on either side of the anode contact finger and from the region directly beneath the said finger;

(15) next, photoresist is applied and patterned to expose the $SiO_2$ layer $30_b$, which lies over the ohmic contact pad 34, followed by the etching away of this $SiO_2$ layer $30_b$ to expose the ohmic contact; and

(16) the wafer is then diced apart into individual chips each containing a single diode.

What has been shown and described is an improved whiskerless Schottky diode wherein the deleterious effects of the shunt capacitance, $C_{SH1}$, if not completely eliminated, is substantially reduced in a structure which is relatively simple to fabricate. Critical fabrication steps of ohmic contact formation, anode formation and anode contact pad and finger formation are carried out on a relatively flat, planar surface with the channel or trench being formed near the end of the processing sequence. The diode junction, moreover, exhibits the same DC characteristics as the present state of the art whisker contacted devices. Any shunt capacitance remaining is mainly attributed to the fringing field between the anode contact pad 32, finger element 36 and ohmic contact pad 34.

The device, in accordance with the subject invention, has many applications in the millimeter and submillimeter range, including use as waveguide mixers, planar mixers and planar arrays, multipliers, varactor tuners and various other types of integrated circuits.

Having thus shown and described what is at present considered to be the preferred embodiment of the invention as well as its method of fabrication, it should be noted that the same has been made by way of illustration and not limitation. Accordingly, all modifications, alterations and changes, coming within the spirit and scope of the invention as set forth in the appended claims, are herein meant to be included.

We claim:

1. A multi-layered semiconductor Schottky diode comprising:
   a plurality of contiguous semiconductor, semi-insulating or insulating layers and including an anode;
   an outer layer of ohmic contact metallization formed on said plurality of layers;
   an outer layer of anode contact metallization, including a contact pad region, formed on said plurality of layers,
   said layer of anode contact metallization further including a relatively narrow anode contact finger extending from said contact pad region to said anode; and
   means for reducing the internal shunt capacitance of said diode including a trench of predetermined depth formed in a selected number of said layers beneath said contact finger.

2. The diode as defined by claim 1 wherein said trench extends beneath said anode contact finger in a direction which is transverse to the narrow dimension of said anode contact finger.

3. The diode as defined by claim 1 wherein said selected number of layers comprises at least one active layer of selectively doped semiconductor material.

4. The diode as defined by claim 1 wherein said plurality of contiguous semiconductor, semi-insulating or insulating layers include a pair of doped semiconductor active layers.

5. The diode as defined by claim 4 wherein one layer of said pair of doped semiconductor layers is more heavily doped than the other layer.

6. The diode as defined by claim 5 wherein said semiconductor layers are selected from Group III-V semiconductor material.

7. The diode as defined by claim 6 wherein said semiconductor material comprises gallium arsenide.

8. The diode as defined by claim 7 wherein said doped gallium arsenide layers are doped with n type of impurities.

9. The diode as defined by claim 7 wherein one of said semi-insulating or insulating layers comprises a layer of gallium arsenide on one side of and contiguous to said more heavily doped layer of gallium arsenide and wherein another semi-insulating or insulating layer comprises at least one layer of silicon dioxide on the other side of and displaced from said more heavily doped layer and sandwiched between and contiguous to both the less heavily doped layer of gallium arsenide and said outer layer of anode contact metallization.

10. The diode as defined by claim 9 wherein said layer of ohmic contact metallization is formed on one of the doped gallium arsenide layers.

11. A semiconductor diode device, comprising:
a substrate of semi-insulating or insulating material;
at least one active layer of selectively doped semiconductor material selected from Group III-V semiconductor materials on said substrate;
at least one layer of semi-insulating or insulating material contiguous with the top surface of said at least one active layer;
an anode including a metal-semiconductor junction located in a region of said active layer and having an aperture window thereat through said at least one layer of semi-insulating or insulating material;
a first outer layer of metallization on said at least one layer of semi-insulating or insulating material and including an anode contact pad and a contact finger which projects from said contact pad to said anode, forming said metal-semiconductor junction thereat;
a second outer layer of metallization on said active layer and including an ohmic contact pad; and
a trench of predetermined depth formed at least in said one active layer, beneath the contact finger and intermediate the anode contact pad and said anode, which significantly reduces the shunt capacitance between the anode contact pad and the metal-semiconductor junction of said anode.

12. The device as defined by claim 11 wherein said at least one active layer comprises a pair of contiguous active layers of same type of semiconductor material with one of said active layers being more heavily doped than the other active layer.

13. The diode device as defined by claim 12 wherein the more heavily doped active layer contacts said substrate.

14. The diode device as defined by claim 13 wherein said active layers are comprised of doped layers of gallium arsenide.

15. The diode device as defined by claim 14 wherein said substrate of semi-insulating or insulating material is comprised of gallium arsenide.

16. The diode device as defined by claim 15 wherein said at least one layer of semi-insulating or insulating material comprises two contiguous layers of silicon dioxide.

17. The diode device as defined by claim 11 wherein said at least one active layer is comprised of doped gallium arsenide, said substrate of semi-insulating or insulating material is comprised of gallium arsenide and said at least one layer of semi-insulating or insulating material is comprised of silicon dioxide.

18. The diode device as defined by claim 17 wherein said at least one active layer comprises a pair of contiguous layers of doped gallium arsenide, and wherein said first and second outer layers of metallization are formed on the outer surface, remote from said substrate, of said silicon dioxide and gallium arsenide, respectively.

19. The diode device as defined by claim 18 wherein said pair of active layers of gallium arsenide include proton bombardment of the regions underlying the anode contact pad for further reducing said shunt capacitance.

20. The diode as defined by claim 1 wherein said trench is filled with a dielectric.

21. The diode as defined by claim 11 wherein said trench is filled with a dielectric.

22. A planar Schottky diode comprising:
a generally planar chip including a plurality of conducting, semiconductor, semi-insulating, or insulating layers;
one of said plurality of layers being an inactive insulating or semi-insulating substrate;
a second of said plurality of layers being one or more active semiconductor layer or layers adjacent to and contiguous with said inactive insulating or semi-insulating substrate;
a third of said plurality of layers being an insulating or semi-insulating layer or layers adjacent to and contiguous with said active semiconductor layer or layers and remote from said inactive insulating or semi-insulating substrate;
a fourth of said plurality of layers being a conducting layer which is adjacent to and contiguous with said third insulating or semi-insulating layer and generally remote from said one or more active semiconductor layer or layers, said conducting layer being comprised of a relatively large area anode contact pad and an elongated finger protruding therefrom; and
a trench, including a non-conducting material therein, which extends beneath said finger and through at least said one or more active semiconductor layer or layers.

23. The Schottky diode as defined by claim 22 wherein said second of said plurality of layers includes first and second layered portions contiguous with each other, the first of which is more heavily doped than the second and contiguous with said insulating or semi-insulating, substrate, and the second of which is contiguous with said third insulating or semi-insulating layer.

24. The Schottky diode as defined by claim 22 wherein a small portion of said finger extends into said insulating or semi-insulating layer or layers and conductively contacts said active semiconductor layer or layers.

25. The Schottky diode as defined by claim 23 wherein a small portion of said finger extends into said third or semi-insulating layer or layers and conductively contacts said less heavily doped layered portion.

26. The Schottky diode as defined by claim 22 wherein said trench lies in a plane which is generally parallel to said conducting layer and extends across said chip.

27. The Schottky diode as defined by claim 23 wherein said trench extends to the interface of said more heavily doped layered portion with said insulating or semi-insulating substrate.

28. The Schottky diode as defined by claim 23 wherein said trench extends into said insulating or semi-insulating substrate.

29. The Schottky diode as defined by claim 22 wherein said trench is filled with a dielectric.

30. The diode as defined by claim 20 wherein said trench is open and filled with air.

31. The diode as defined by claim 1 wherein said trench surrounds said contact pad region.

32. The diode as defined by claim 21 where said trench is open and filled with air.

33. The diode as defined by claim 11 wherein said trench surrounds said anode contact pad.

34. The Schottky diode as defined by claim 29 wherein said trench is open and filled with air.

35. The Schottky diode as defined by claim 22 wherein said trench is generally transverse to said finger.

36. The Schottky diode of claim 22 wherein said trench surrounds said large area anode contact pad.

37. The Schottky diode of claim 22 wherein:
said one of said plurality of layers is a semi-insulating gallium arsenide substrate, said second of said plurality of layers are two active gallium arsenide semiconductor layers, and said third of said plurality of layers is at least one insulating layer of silicon dioxide.

* * * * *